United States Patent [19]
Gallagher et al.

[11] Patent Number: 5,841,692
[45] Date of Patent: Nov. 24, 1998

[54] MAGNETIC TUNNEL JUNCTION DEVICE WITH ANTIFERROMAGNETICALLY COUPLED PINNED LAYER

[75] Inventors: William Joseph Gallagher, Ardsley, N.Y.; Stuart Stephen Papworth Parkin, San Jose, Calif.; John Casimir Slonczewski, Katonah; Jonathan Zanhong Sun, Mohegan Lake, both of N.Y.

[73] Assignee: International Business Machines Corporation, Armonk, N.Y.

[21] Appl. No.: 895,118

[22] Filed: Jul. 16, 1997

Related U.S. Application Data

[63] Continuation of Ser. No. 618,300, Mar. 18, 1996, Pat. No. 5,650,958.

[51] Int. Cl.⁶ .................................................. G11C 11/15
[52] U.S. Cl. ........................................ 365/173; 365/158
[58] Field of Search ..................... 365/171, 173

[56] References Cited

U.S. PATENT DOCUMENTS

| | | | |
|---|---|---|---|
| 3,623,038 | 11/1971 | Randolph et al. | 340/134 |
| 5,055,158 | 10/1991 | Gallagher et al. | 156/643 |
| 5,390,061 | 2/1995 | Nakatani et al. | 360/113 |
| 5,432,734 | 7/1995 | Kawano et al. | 365/158 |

FOREIGN PATENT DOCUMENTS

WO 95/10123  4/1995  WIPO .............................. H01L 43/08

OTHER PUBLICATIONS

J. M. Daughton, "Magnetoresistive Memory Technology", *Thin Solid Films*, vol. 216, 1992, pp. 162–168.
G. R. Harp et al., "Seeded Epitaxy of Metals by Sputter Deposition", *Applied Physics Letters*, vol. 65, No. 24, Dec. 12, 1994, pp. 3063–3065.
M. Julliere, "Tunneling Between Ferromagnetic Films", *Physics Letters*, vol. 54A, No. 3, Sep. 8, 1975, pp. 225–226.
K. P. Kamper et al., "$CrO_2$—A New Half–metallic Ferromagnet?", *Physical Review Letters*, vol. 59, No. 24, Dec. 14, 1987, pp. 2788–2791.
M. B. Ketchen et al., "Sub $\mu$m Linewidth Input Coils for Low $T_c$ Integrated Thin–film DC Superconducting Quantum Interference Devices", *Applied Physics Letters*, vol. 61, No. 3, Jul. 20, 1992, pp. 336–338.
K. Matsuyama et al., "Fabrication of Microstructured Magnetic Tunneling Valve Junction", *IEEE Transactions on Magnetics*, vol. 31, No. 6, Nov. 1995, pp. 3176–3178.
R. Meservey et al., "Spin–polarized Electron Tunneling", *Physics Reports*, vol. 238, No. 4, 1994, pp. 214–217.

(List continued on next page.)

*Primary Examiner*—David C. Nelms
*Assistant Examiner*—Michael T. Tran
*Attorney, Agent, or Firm*—Thomas R. Berthold

[57] ABSTRACT

A magnetic tunnel junction (MTJ) device is usable as a magnetic field sensor or as a memory cell in a magnetic random access (MRAM) array. The MTJ device has a "pinned" ferromagnetic layer whose magnetization is oriented in the plane of the layer but is fixed so as to not be able to rotate in the presence of an applied magnetic field in the range of interest, a "free" ferromagnetic layer whose magnetization is able to be rotated in the plane of the layer relative to the fixed magnetization of the pinned ferromagnetic layer, and an insulating tunnel barrier layer located between and in contact with both ferromagnetic layers. The pinned ferromagnetic layer is formed as a sandwich of two antiferromagnetically coupled ferromagnetic layers separated by a metallic layer. The free and pinned ferromagnetic layers are located in separate spaced-apart planes so as to not overlap the tunnel barrier layer. An insulating layer surrounds the lateral perimeter of at least the free ferromagnetic layer and supports an electrical lead that makes contact with the free ferromagnetic layer.

5 Claims, 12 Drawing Sheets

OTHER PUBLICATIONS

T. Miyazaki et al., "Large Magnetoresistance Effect in 82Ni–Fe/Al–Al$_2$O$_3$/Co Magnetic Tunneling Junction", *Journal of Magnetism and Magnetic Materials*, vol. 98, 1991, pp. L7–L9.

T. Miyazaki et al., "Giant Magnetic Tunneling Effect in Fe/Al$_2$O$_3$/Fe Junction", *Journal of Magnetism and Magnetic Materials*, vol. 139, 1995, pp. L231–L234.

J. S. Moodera et al., "Variation of the Electron–spin Polarization of EuSe Tunnel Junctions from Zero to Near 100% in a Magnetic Field", *Physical Review Letters*, vol. 70, No. 6, Feb. 8, 1993, pp. 853–856.

J. S. Moodera et al., "Large Magnetoresistance at Room Temperature in Ferromagnetic Thin Film Tunnel Junctions", *Physical Review Letters*, vol. 74, No. 16, Apr. 17, 1995, pp. 3273–3276.

S. S. P. Parkin, "Origin of Enhanced Magnetoresistance of Magnetic Multilayers: Spin–dependent Scattering from Magnetic Interface States", *Physical Review Letters*, vol. 71, No. 10, Sep. 6, 1993, pp. 1641–1644.

J. C. Slonczewski, "Magnetic Bubble Tunnel Detector", *IBM Technical Disclosure Bulletin*, vol. 19, No. 6, Nov. 1976, pp. 2328–2330.

J. C. Slonczewski, "Magnetic–field Tunnel–sensor", *IBM Technical Disclosure Bulletin*, vol. 19, No. 6, Nov. 1976, pp. 2331–2332.

J. C. Slonczewski, "Magnetic–barrier Current Amplifier", *IBM Technical Disclosure Bulletin*, vol. 19, No. 6, Nov. 1976, pp. 2333–2336.

C. Tsang et al., "Design, Fabrication & Testing of Spin–valve Read Heads for High Density Recording", *IEEE Transactions on Magnetics*, vol. 30, No. 6, Nov. 1994, pp. 3801–3806.

R. Wiesendanger et al., "Observation of Vacuum Tunneling of Spin–polarized Electrons with the Scanning Tunneling Microscope", *Physical Review Letters*, vol. 65, No. 2, Jul. 9, 1990, pp. 247–250.

T. Yaoi et al., "Dependence of Magnetoresistance on Temperature and Applied Voltage in a 82Ni–Fe/Al–Al$_2$O$_3$/Co Tunneling Junction", *Journal of Magnetism and Magnetic Materials*, vol. 126, 1993, pp. 430–432.

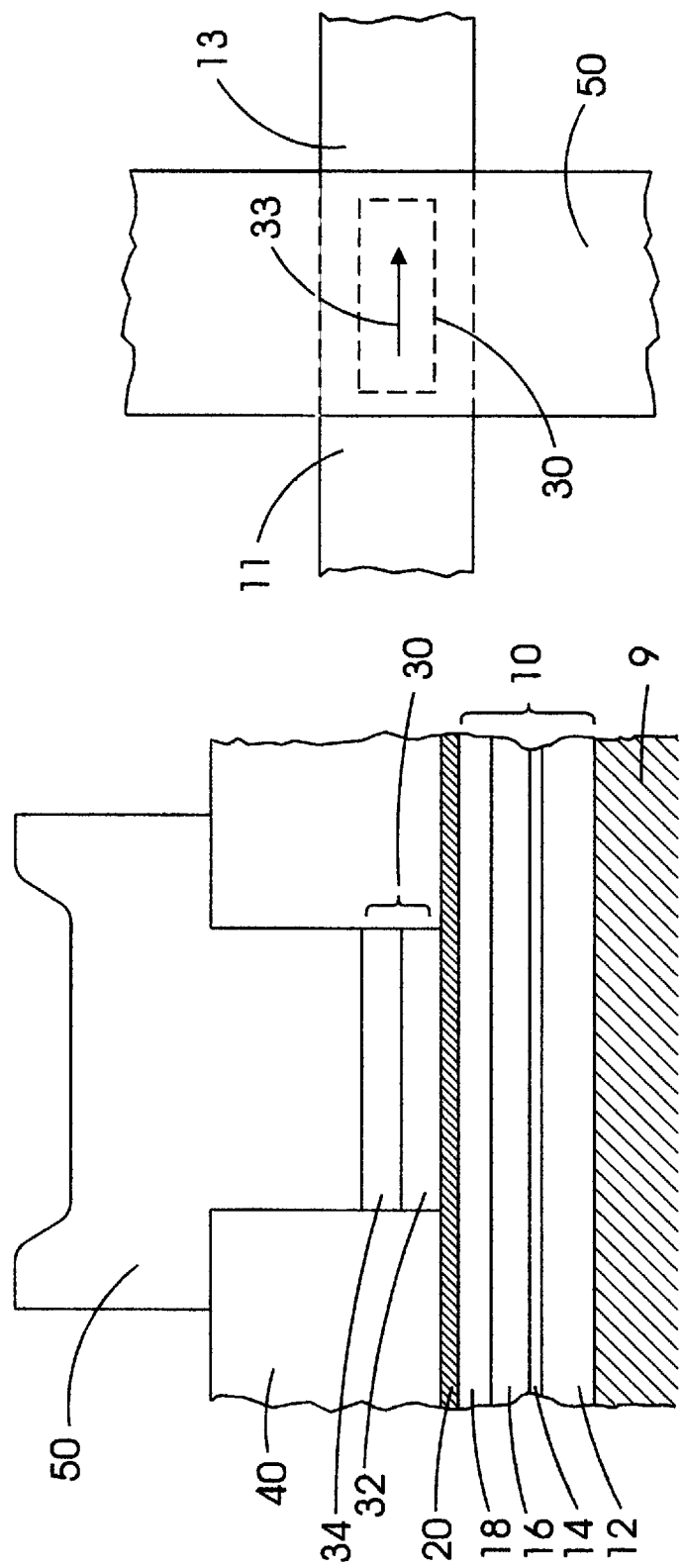

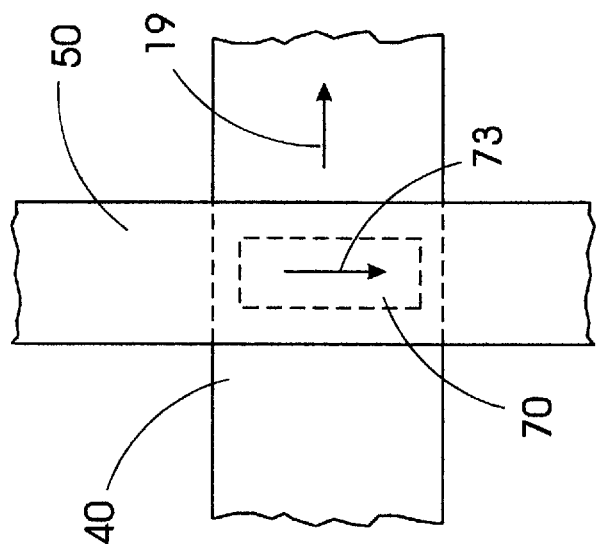
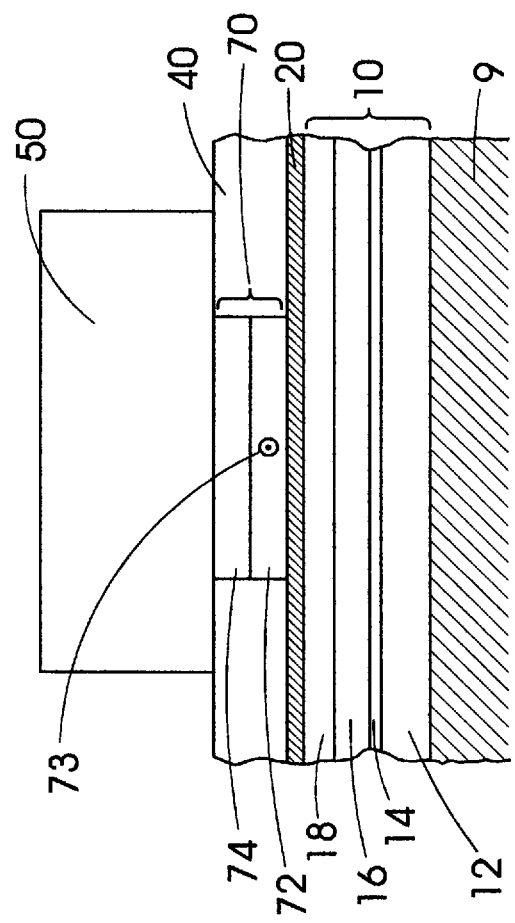
FIG. 6B
FIG. 6A

MAGNETIC TUNNEL JUNCTION DEVICE WITH ANTIFERROMAGNETICALLY COUPLED PINNED LAYER

This is a continuation of application Ser. No. 08/618,300 filed on Mar. 18, 1996 now Pat. No. 5,650,958

TECHNICAL FIELD

This invention relates to magnetic tunnel junction (MTJ) devices for memory and sensing applications. More particularly it relates to MTJ devices where the magnetic field response of each of the electrodes of the MTJ is controlled.

BACKGROUND OF THE INVENTION

A magnetic tunnel junction is a device comprised of two ferromagnetic electrodes separated by a thin insulating layer and based on the phenomenon of spin-polarized electron tunneling. One of the ferromagnetic electrodes has a higher coercivity than the other. The insulating layer is thin enough that quantum mechanical tunneling occurs between the ferromagnetic electrodes. The tunneling phenomenon is electron spin dependent, making the magnetic response of the junction a function of the relative orientations and spin polarizations of the two electrodes. FIG. 1 shows a prior art MTJ device with Co and Co—Fe layers separated by an alumina ($Al_2O_3$) insulating tunneling layer. FIG. 2 illustrates a typical result for the dependence of the junction resistance on the applied magnetic field. The magnetoresistance ($\Delta R/R$) response is hysteretic with a peak of maximum resistance occurring as the field is swept from a substantial value (e.g., 10–200 Oe) in one direction to a substantial value in the opposite direction. Near the middle of the sweep the resistance is a maximum when the magnetization vectors of the two electrodes point in substantially opposite directions, as indicated by the arrows above the magnetoresistance curve.

Although the possibility of applications for MTJ devices involving tunneling between ferromagnets has long been recognized, serious interest has lagged because of difficulties in achieving responses of the magnitude predicted in practical structures and at noncryogenic temperatures.

Prior to the present invention as described below, there have been no demonstrations of working MTJ devices with usefully large magnetoresistance responses (e.g., on the order of 10%) at room temperature in practical microelectronic device configurations. Experimental results for tunneling between ferromagnets were reviewed by R. Meservey et al. in "Spin-polarized Electron Tunneling"*Physics Reports*, Vol. 238, pp. 214–217, and showed only very small responses at room temperature, at best being on the order of 1–2%. The only indications of reasonably-sized responses were from two experiments with scanning tunneling microscopes. One of these employed a 100% spin-polarized $CrO_2$ tip and indicated a polarized current modulation of 40% at room temperature, as described by R. Wiesendanger et al. in "Observation of Vacuum Tunneling of Spin-polarized Electrons with the Scanning Tunneling Microscope"*Physics Review Letters*, Vol. 65, page 247 (1990).

A very large MTJ device with an 18% magnetoresistance response was reported by T. Miyazaki et al. in "Giant Magnetic Tunneling Effect in Fe/$Al_2O_3$/Fe Junction"*Journal of Magnetism and Magnetic Materials*, Vol. 139, No. L231 (1995). However, the authors report that they could not reproduce their 18% magnetoresistance result. Other junctions fabricated at the same time had responses of only 1–6%.

Others have reported MTJ devices with magnetoresistance of up to 18% at room temperature in large Co—Fe/$Al_2O_3$/Co junctions, as described by J. S. Moodera et al. in "Large Magnetoresistance at Room Temperature in Ferromagnetic Thin Film Tunnel Junctions"*Physics Review Letters*, Vol. 74, page 3273 (1995). However, these devices were formed by complex methods, including evaporation onto cryogenically-cooled substrates. The junction resistances were in the range of hundreds of Ohms to tens of kOhms for junctions with large cross-sectional areas of 200×300 $\mu m^2$.

Thus, it is apparent that it has been difficult to make MTJ devices at room temperature with a large enough magnetoresistance response to be useful. The first observation of a magnetoresistance response of the expected magnitude at room temperature occurred in a spin-polarized scanning tunneling microscope. Subsequently in the prior art, MTJ responses of the expected magnitude at room temperature have been obtained, but only for large devices made using exotic and impractical thin film deposition techniques. It has not yet been demonstrated how to achieve a large magnetoresistance response in a practical microelectronic device configuration.

An additional problem with prior art MTJ devices is that the magnetoresistance response versus magnetic field has the characteristic two-hump shape response illustrated in FIG. 2. A step-like magnetoresistance response has been demonstrated over a restricted applied magnetic field range, as described by T. Miyazaki et al. in "Large Magnetoresistance Effect in 82Ni—Fe/Al—Al2O3/Co Magnetic Tunneling Junction"*Journal of Magnetism* and *Magnetic Materials*, Vol. 98, No. L7 (1991). However, if the applied magnetic field excursion were momentarily too large, the magnetoresistance response characteristic could be inverted, as shown in FIGS. 3A–3B.

What is needed is an MTJ device with unambiguous and controlled magnetoresistance response to magnetic signals that can be mass fabricated and can be scaled down in size to deep submicron dimensions.

SUMMARY OF THE INVENTION

The invention is a magnetic tunnel junction (MTJ) device with one of the ferromagnetic layers having its magnetization fixed or pinned. The MTJ device comprises a pinned ferromagnetic layer whose magnetization is oriented in the plane of the layer but is fixed so as to not be able to rotate in the presence of an applied magnetic field in the range of interest, a "free" ferromagnetic layer whose magnetization is able to be rotated in the plane of the layer relative to the fixed magnetization of the pinned ferromagnetic layer, and an insulating tunnel barrier layer located between and in contact with both ferromagnetic layers. The pinned ferromagnetic layer is pinned by interfacial exchange coupling with an adjacent antiferromagnetic layer. In the field sensing application of the MTJ device, the free ferromagnetic layer's magnetization is oriented generally perpendicular to the pinned layer's magnetization and can rotate through a range as a function of the external field strength being sensed. In the memory cell application of the MTJ device, the free ferromagnetic layer's magnetization is oriented either parallel or antiparallel to the pinned ferromagnetic layer's magnetization. The MTJ memory cell is written, i.e., its magnetic state is altered, by magnetic fields associated with write currents that pass horizontally through the MTJ electrodes without passing perpendicularly through the MTJ tunnel barrier layer. These fields cause the magnetization of the free ferromagnetic layer to rotate from parallel to antiparallel (or vice-versa). Since the tunneling current that flows perpendicularly through the tunnel barrier layer depends on the relative magnetization directions of the two ferromagnetic layers, the magnetic state of the MTJ memory cell can be sensed by detecting the change in electrical resistance across the MTJ. The top electrode of the MTJ is surrounded by insulating material and contacted with an electrical lead through a hole in the insulating material. This allows the top and bottom electrodes, which contain the respective ferromagnetic layers, to be formed in two separate spaced-apart planes that do not overlap in the region of the tunnel barrier layer, thereby eliminating any extraneous magnetic poles. The MTJ devices have unambiguous magnetic field response in low magnetic fields, and can be made to submicron dimensions using conventional film growth techniques at ambient temperatures that are suitable for use in mass production.

For a fuller understanding of the nature and advantages of the present invention, reference should be made to the following detailed description taken together with the accompanying figures.

BRIEF DESCRIPTION OF THE DRAWING

FIGS. 4A–4B show a cross-section view and a top view, respectively, of an MTJ device of the present invention configured for a memory cell application, with a self-aligned contact hole through the insulator.

FIGS. 6A–6B show a cross-section view and a top view, respectively, of an MTJ device of the present invention configured for a field-sensing application.

DESCRIPTION OF THE PREFERRED EMBODIMENTS

MTJ Memory Cell

Figure 1:
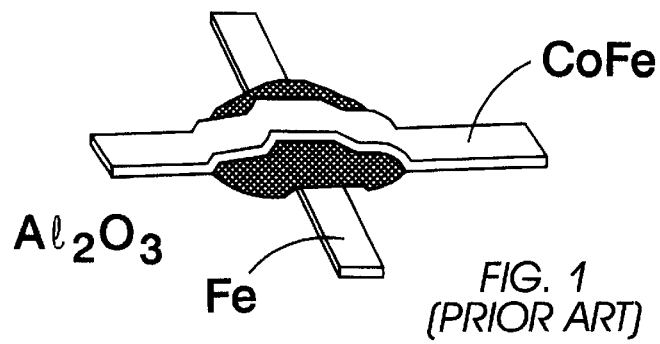
FIG. 1 is a perspective view of a prior art MTJ device.
Figure 2:
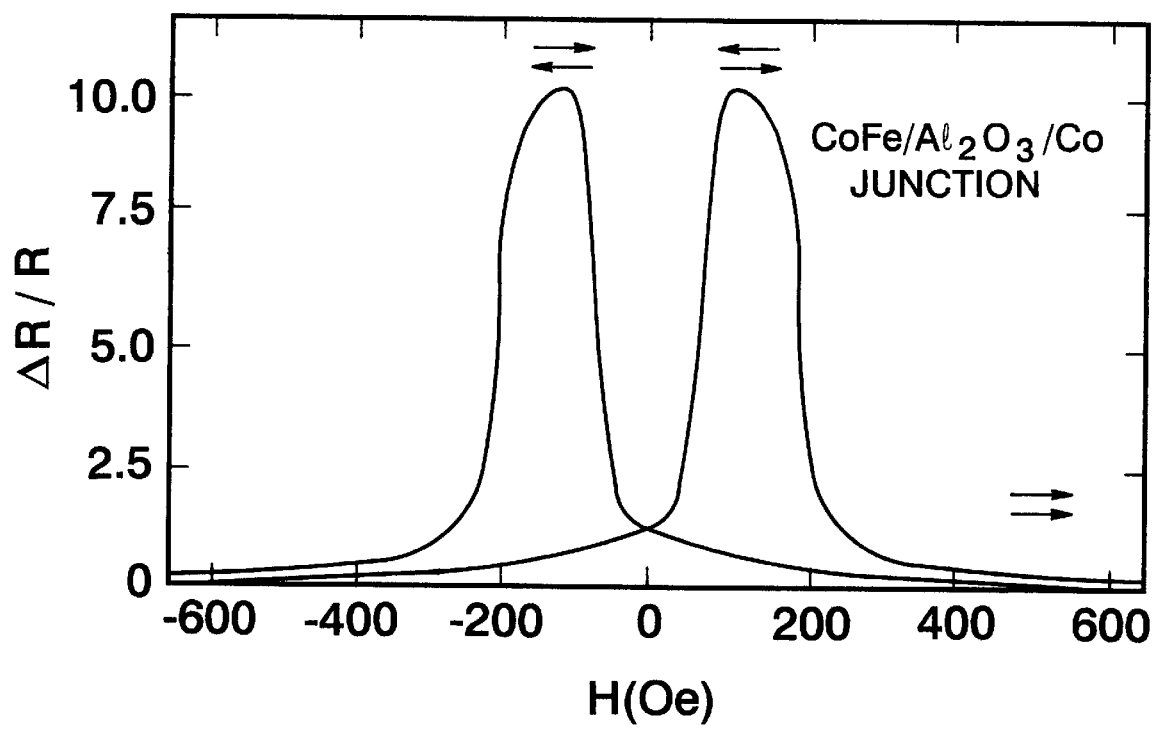
FIG. 2 shows the two-peak magnetoresistance response of a prior art MTJ device.

FIGS. 4A–4D illustrate schematically three embodiments for MTJ structures suitable for a magnetic memory cell application. The first embodiment, shown in cross-section in FIG. 4A and from a top view in FIG. 4B, comprises a substrate 9, a base electrode multilayer stack 10, an insulating tunnel barrier layer 20, a top electrode stack 30, an insulating layer 40 with a contact hole through it, and a contact and top wiring layer 50 that itself may be a multilayer structure. The tunnel barrier layer 20 is sandwiched between the two ferromagnetic layer stacks 10 and 30.

The base electrode layer stack 10 formed on substrate 9 includes a first seed layer 12 deposited on substrate 9, a "template" ferromagnetic layer 14 on the seed layer 12, a layer of antiferromagnetic material 16 on the template layer 14, and a "pinned" ferromagnetic layer 18 formed on and exchange coupled with the underlying antiferromagnetic layer 16. The ferromagnetic layer 18 is called the pinned layer because its magnetization direction is prevented from rotation in the presence of applied magnetic fields in the desired range of interest for the MTJ device. The top electrode stack 30 includes a "free" ferromagnetic layer 32 and a protective layer 34 formed on the free layer 32. The ferromagnetic layer 32 is not pinned by exchange coupling, and is thus free to rotate in the presence of applied magnetic fields in the range of interest. Both of the ferromagnetic layers 18 and 32 in electrode stacks 10 and 30, respectively, are fabricated so as to have their easy axes of magnetization generally parallel to one another in the same direction parallel to the length of the bottom wiring layer, which is formed as the extensions 11, 13 of base electrode 10 (FIG. 4B). This direction is shown by the arrow 33 in FIG. 4B. The insulating layer 40 has a self-aligned contact hole through to the top of the top junction electrode stack 30. The pinned ferromagnetic layer 18 in stack 10 just beneath the tunnel barrier layer 20 has its magnetization pinned by interfacial exchange coupling with the immediately underlying antiferromagnetic layer 16, which also forms part of base electrode stack 10. For magnetic fields of magnitude comparable to those applied to the memory cell during read and write operations of the cell, there is only one possible orientation for the magnetization of the pinned ferromagnetic layer 18. The free ferromagnetic layer 32 in top electrode stack 30 is anisotropic in its magnetization properties, but its magnetization direction or vector is not pinned. Rather, its magnetization vector can be stably oriented along either direction of the easy axis by the application of a magnetic field in the desired range.

Figure 4C:
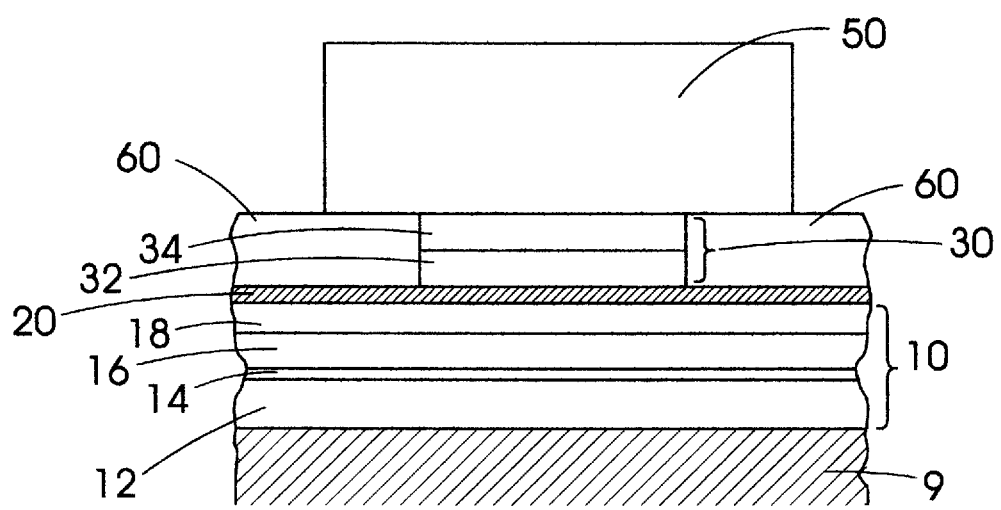
FIG. 4C shows a cross-section view of an MTJ device according to the present invention with a planarized, self-aligned contact hole.

FIG. 4C illustrates the cross-section for a structure similar to that in FIGS. 4A and 4B, except the insulating layer is a planarized insulating layer 60 with a self-aligned contact hole to the top junction electrode stack 30. Versions of this MTJ device with an insulating layer that does not have a self-aligned contact hole to the top junction electrode 30 are also possible, although less desirable because extra tolerances would have to be allowed for in fabrication.

Figure 4D:
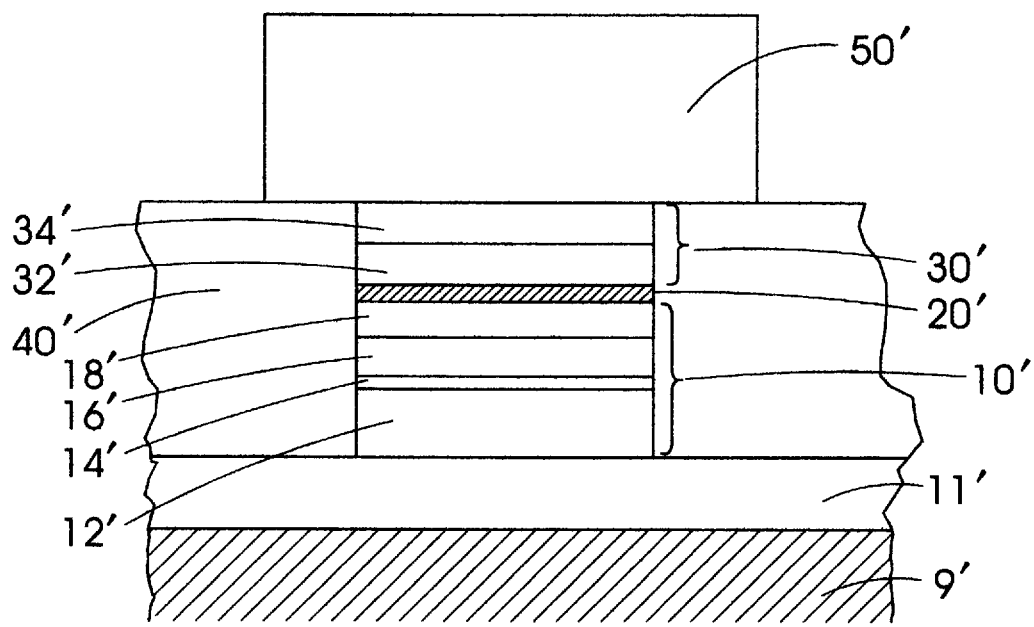
FIG. 4D shows the cross-section of an MTJ memory cell similar to that of FIG. 4A, except that both electrodes and the insulating tunnel barrier have the same cross-sectional area.

FIG. 4D illustrates the cross-section of a cell similar to that of FIGS. 4A and FIG. 4C except that the base electrode stack 10', the insulating tunnel barrier 20', and the top electrode stack 30' all have the same cross-sectional area. The base electrode stack 10' is formed on wiring lead 11' that is formed on the substrate 9. The insulating layer 40' surrounds the entire MTJ device and extends down to lead 11'. This structure allows for the memory cell to be readily fabricated on top of electronic devices, such as a diode or transistor, for manipulating sense current through the individual magnetic cells.

A representative set of materials for MTJ devices with the structure illustrated in FIGS. 4A–4B will now be described. The MTJ base electrode stack 10 comprises a stack of 20 nm Pt/4 nm $Ni_{81}Fe_{19}$/10 nm $Mn_{50}Fe_{50}$/8 nm $Ni_{81}Fe1_{19}$ (layers 12, 14, 16, 18, respectively) grown on an intrinsic silicon wafer that serves as substrate 9. The stack 10 is grown in the presence of a magnetic field applied parallel to the surface of the substrate wafer. The magnetic field serves to orient the easy axis of the initial 4 nm Ni—Fe layer 14, which serves as a template to orient the $Mn_{50}Fe_{50}$ antiferromagnetic layer 16. Layer 16 pins the magnetization direction of the 8 nm Ni—Fe free ferromagnetic layer 18 by exchange coupling. Next, the tunnel barrier layer 20 is formed by depositing and then plasma oxidizing a 1–2 nm Al layer. This creates the Al²O₃ insulating tunnel barrier layer 20. The MTJ top electrode stack 30 is an 8 nm Co/20 nm Pt stack (layers 32, 34, respectively) having a cross-sectional area of a few $\mu m^2$ or less. It is important that the layers in the bottom electrode stack 10 be smooth, and that the $Al_2O_3$ layer 20 be free of pin-holes which would electrically short the junction. For example, growth by sputtering techniques known to produce good giant magnetoresistance effects in metallic multilayer stacks is sufficient. The top electrode stack 30 is surrounded by a 160 nm $SiO_2$ insulation layer 40 with a through-hole self-aligned down to the junction. The junction is contacted by a 20 nm Ag/300 nm Au contact layer 50 that serves as the top wiring lead (FIG. 4B). In this MTJ device, all the ferromagnetic layers have their easy axes aligned in the same direction. The patterns in the ferromagnetic layers are aligned with their long dimensions along the direction of the easy magnetic axis (as shown by the arrow 33 in FIG. 4B), thereby allowing shape anisotropy to add to the intrinsic anisotropy of each ferromagnetic layer. This MTJ structure was fabricated by sputtering all the layers in the junction stack (layers 12, 14, 16, 18, 20, 32, 34) onto the silicon substrate at ambient temperature, ion milling the junction in two steps to define the bottom wiring level and the top junction electrode level, depositing and patterning an insulating layer 40 with through-holes self-aligned to allow for contacting the top junction electrode stack, and finally depositing through a lift-off stencil the contact layer 50. For dense memory applications using cells of the type shown in FIGS. 4A and 4C, it is important that the free ferromagnetic layer 32, which stores the bit of information by its magnetization orientation, be as small as possible consistent with the lithographic processes used. This is why in FIGS. 4A and 4C the bottom junction electrode stack 10 is the larger area and contains the pinned ferromagnetic layer 18. For the cell shown in FIG. 4D, the free 32' and pinned 18' ferromagnetic layers are of the same size and shape, and the pinned layer 18' can be located in either the bottom or top electrode stacks. When the pinned ferromagnetic layer is in the bottom electrode, the top electrode can be simpler and would consist of only one ferromagnetic layer. This MTJ device would have a top electrode stack with a structure, for example, of 8 nm Ni—Fe/10–15 nm $Mn_{50}Fe_{50}$.

For the memory cell application of the MTJ device, writing to the MTJ is accomplished by passing currents through the top 50 and bottom 11, 13 electrode wiring layers (FIGS. 4A–4B). When a sufficiently large current is passed through both of these lines the combined magnetic field that they generate in the vicinity of the free ferromagnetic layer 32 will cause the magnetization of the free ferromagnetic layer 32 to rotate from being parallel to antiparallel (or vice-versa) to the magnetization direction of the pinned ferromagnetic layer 18. The current levels are selected so that the combined magnetic field they generate exceeds the switching field of the free ferromagnetic layer. This is determined predominantly by the magnetic anisotropy of the free ferromagnetic layer. This field generated by the combined write currents is selected to be much smaller than the field required to rotate the magnetization of the pinned ferromagnetic layer. The write currents do not pass perpendicularly through the MTJ, which has a high resistance compared to the resistances of wiring layers 50 and 11, 13.

The MTJ memory cell is read by passing a sense current perpendicularly through the MTJ from the pinned ferromagnetic layer through the tunnel junction barrier to the free ferromagnetic layer (or vice versa). Since the resistance of the $Al_2O_3$ tunnel barrier is strongly dependent on the thickness of the $Al_2O_3$ layer, approximately varying exponentially with the thickness of this layer, this means that the electrical current largely flows perpendicularly through the $Al_2O_3$ tunnel barrier. The probability of a charge carrier tunneling across the barrier falls off strongly with increasing $Al_2O_3$ thickness so the only carriers that tunnel across the junction are those which traverse perpendicular to the junction layer. The state of the memory cell is determined by measuring the resistance of the memory cell when a sense current, much smaller than the write currents, is passed perpendicularly through the MTJ. The self-field of this sense or read current is negligible and does not affect the magnetic state of the memory cell. The probability of tunneling of charge carriers across the tunnel barrier depends on the relative alignment of the magnetic moments of the free and pinned ferromagnetic layers. The tunneling current is spin polarized, which means that the electrical current passing from one of the ferromagnetic layers, for example, the pinned layer, is predominantly composed of electrons of one spin type (spin up or spin down, depending on the orientation of the magnetization of the ferromagnetic layer). The degree of spin polarization of the current is determined by the electronic band structure of the magnetic material comprising the ferromagnetic layer at the interface of the ferromagnetic layer with the tunnel barrier. The first ferromagnetic layer tunnel barrier thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged, neither parallel nor antiparallel, the tunneling probability takes an intermediate value. Thus, the electrical resistance of the MTJ memory cell depends on both the spin polarization of the electrical current and the electronic states in both of the ferromagnetic layers. As a result, the two possible magnetization directions of the free ferromagnetic layer uniquely define two possible bit states (0 or 1) of the memory cell.

Figure 3A:
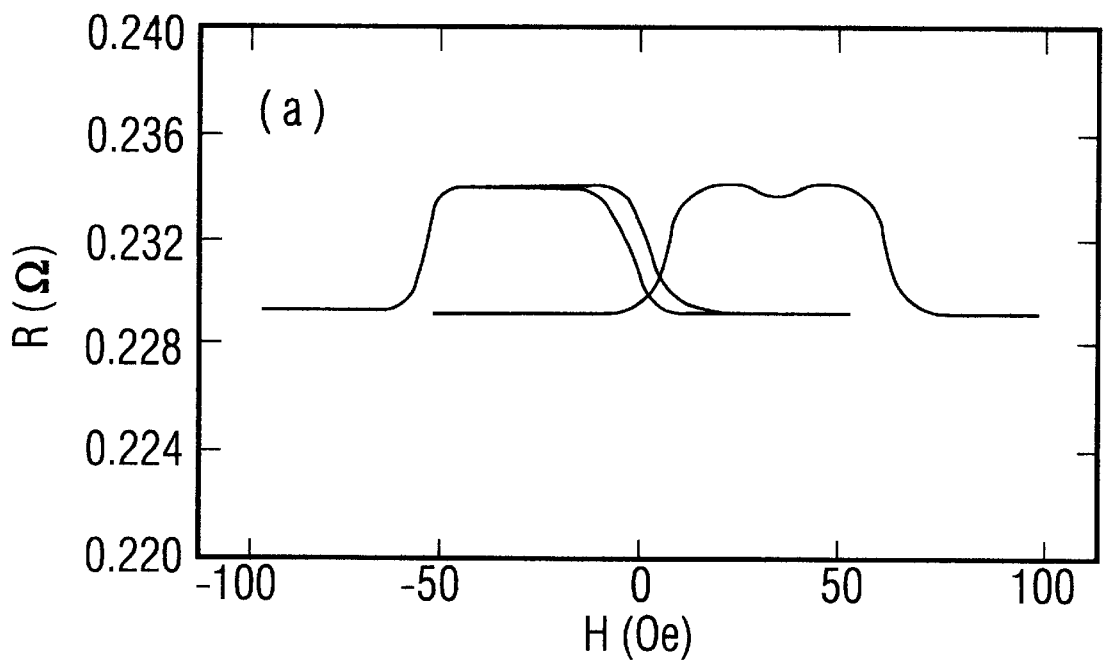
FIGS. 3A–3B show the two possible step-like responses from prior art MTJ devices exposed to an applied field of limited amplitude.
Figure 3B:
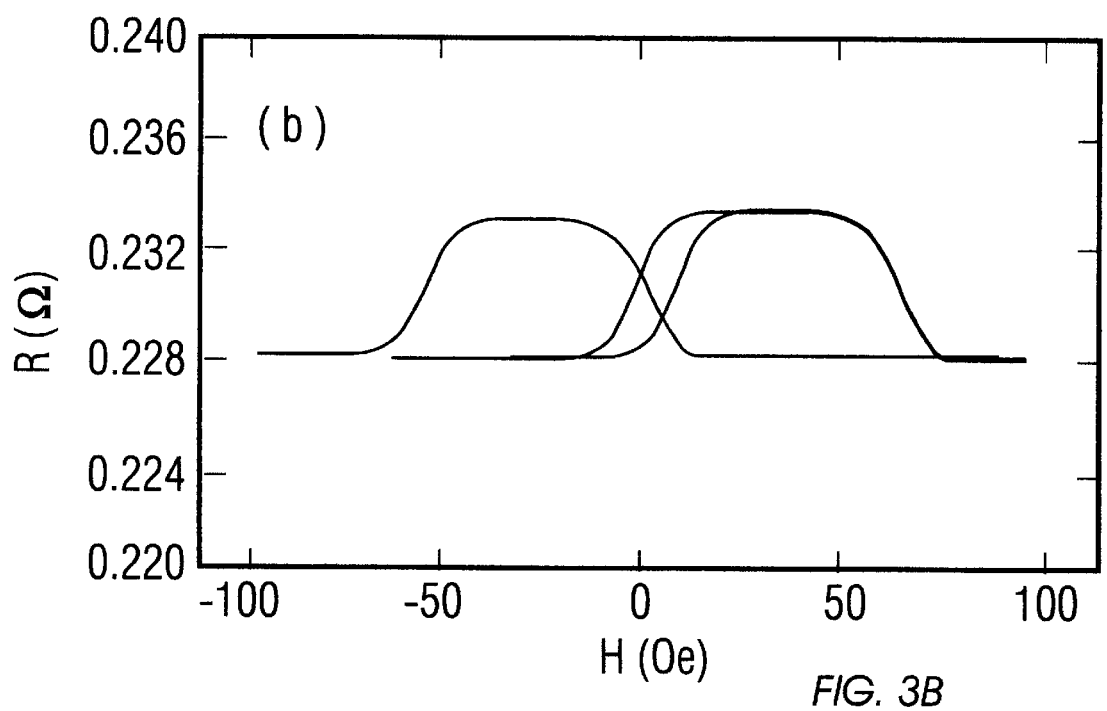
Figure 5A:
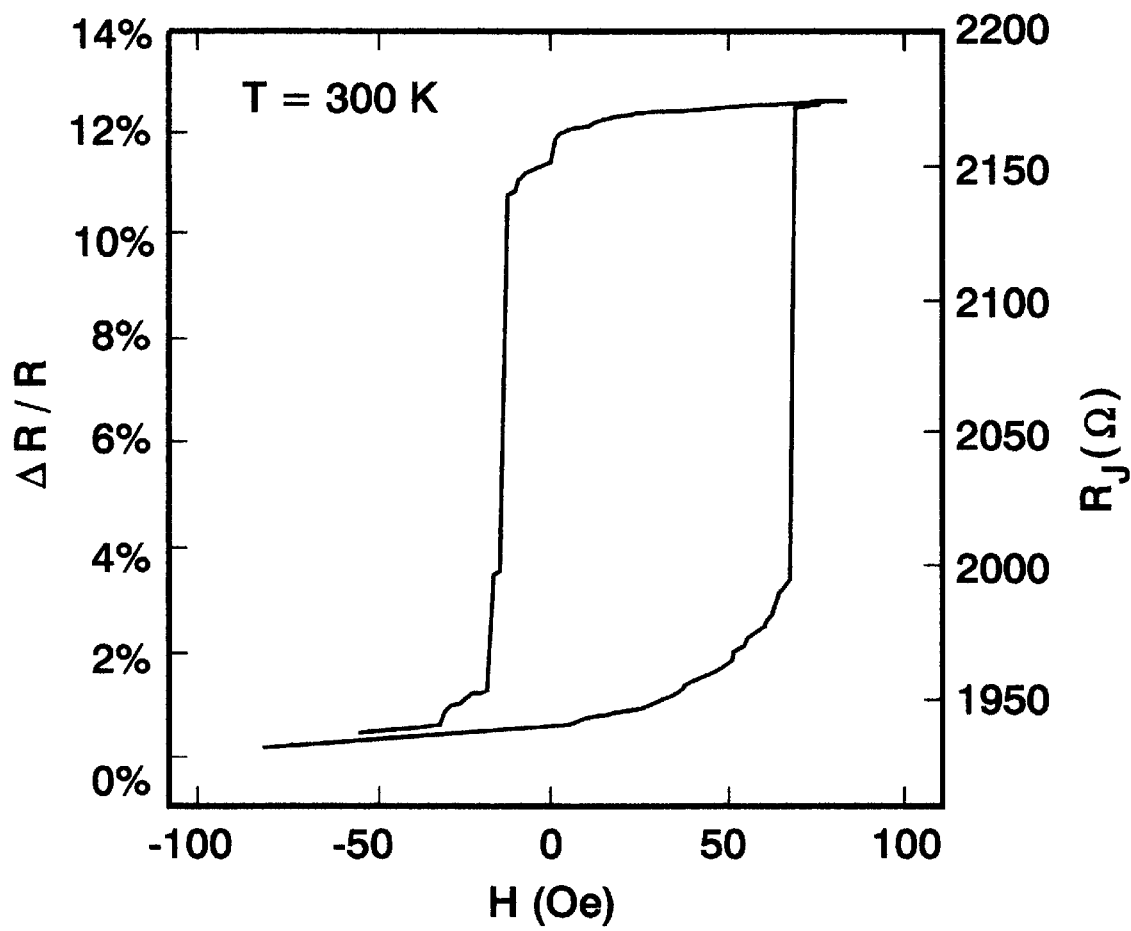
FIGS. 5A–5C show magnetic and magnetoresistance response characteristics from representative MTJ devices of the type shown in FIGS. 4A–4B.
Figure 5B:
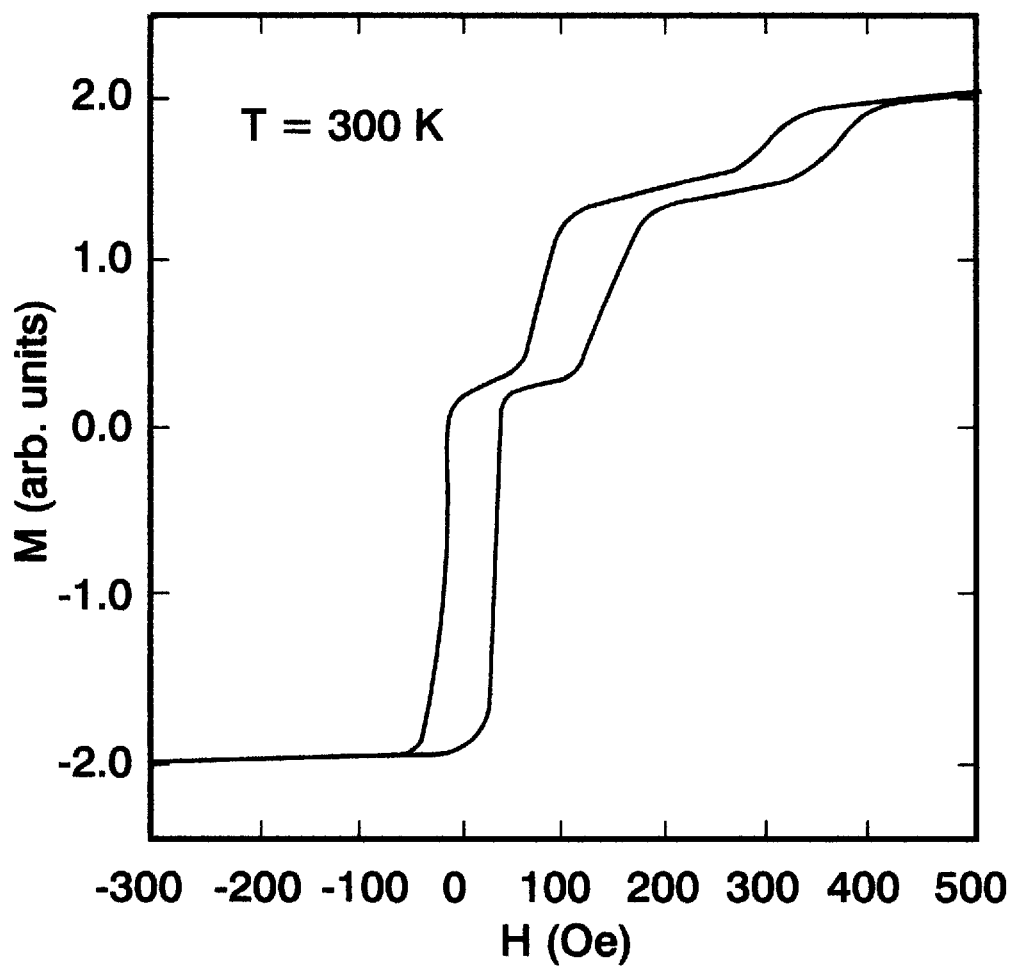
Figure 5C:
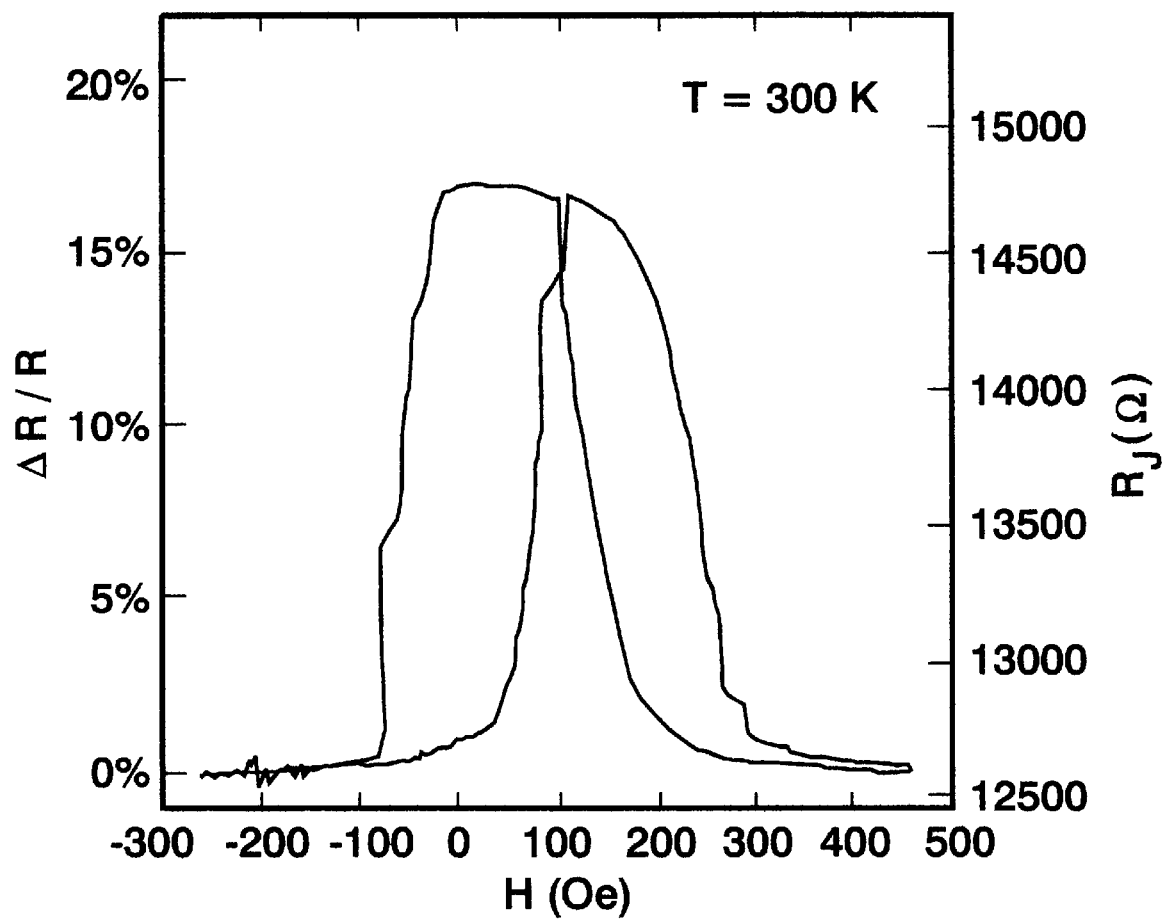

FIGS. 5A–5C show magnetic and magnetoresistance response characteristics from representative MTJ devices fabricated as described for the MTJ device of FIGS. 4A–4B. FIG. 5A shows the low-field (+/–60 Oe) magnetoresistance characteristic of the MTJ device. At zero field there are two stable resistance values for the device. The device resistance at zero field is about 1950 Ohms after the application of a field in the negative direction of magnitude greater than 20–35 Oe. The device resistance at zero field is about 2150 Ohms after the application of a field in the positive direction of magnitude greater than about 60 Oe. These two resistance states result from a magnetization direction reversal of the 8 nm Co/20 nm Pt free ferromagnetic layer 32 in the top junction electrode 30. This electrode was 8 $\mu$m long in the easy axis direction and 2 $\mu$m wide in the hard axis direction. For all applied fields in this low field range, the magnetization of the 8 nm $Ni_{81}Fe_{19}$ pinned ferromagnetic layer 18 in the bottom electrode stack 10 was unchanged due to its pinning by exchange coupling from the $Mn_{50}Fe_{50}$ antiferromagnetic layer 16. The resistance value in the vicinity of zero field depends only on whether the device was most recently exposed to a positive or negative field of the indicated minimum values. Thus, the MTJ device functions as a memory storage element or cell with a resistance that indicates the storage state. In the MTJ device, as shown by FIG. 5A, there is no possibility of an inverted step response, as is possible in the prior art as shown by FIGS. 3A–3B.

The pinning of the ferromagnetic layer 18 in the bottom electrode stack 10 can be seen most clearly from the magnetization data shown in FIG. 5B for a MTJ stack before patterning. The magnetization (M) response for fields lower than about +100 Oe is due entirely to the ferromagnetic layer in the top electrode. For larger positive fields, the magnetization diagram shows the hysteresis associated with the reversal of the junction's bottom electrode ferromagnetic layer (i.e., the 8 nm $Ni_{81}Fe_{19}$ layer 18 that is pinned by exchange coupling to the $Mn_{50}Fe_{50}$ layer 16) at fields of about 90 and 160 Oe. The hysteresis associated with the reversal of the other pinned magnetic layer (i.e., the 4 nm $Ni_{81}Fe_{19}$ template ferromagnetic layer 14 that is also pinned by exchange coupling to the $Mn_{50}Fe_{50}$ layer) is shown at fields of about 300 Oe and 360 Oe. The magnetization data of FIG. 5B can be compared to the large field magnetoresistance response shown in FIG. 5C for an 8×1 $\mu m^2$ MTJ device after patterning. The magnetization reversal of the top electrode is reflected in magnetoresistance changes near approximately −60 Oe and +80 Oe, while the magnetization reversal of the ferromagnetic layer in the junction's bottom electrode is reflected in magnetoresistance changes near approximately 130 Oe and 250 Oe. There is no junction magnetoresistance effect associated with the reversal of the template Ni—Fe layer 14 which is not adjacent to the insulating tunnel layer 20.

The magnetic field needed to cause a magnetization orientation reversal can be supplied by running currents simultaneously through the top and base electrode wiring layers (top layer 50 and bottom layer 11, 13 in FIG. 4B). Running a current through either the top wiring layer or the bottom wiring layer alone will give insufficient field to exceed the threshold realignment field required to change the state of the free ferromagnetic layer 18.

There are several advantages to the MTJ structure of the present invention over the prior art. First, the top ferromagnetic layer 18 is planar. In the prior art (FIG. 1), the top electrode ferromagnetic layer must cross steps. Each time the electrode layer crosses a step there are necessarily magnetic poles at the step edges. These cause undesirable stray magnetic fields, which are particularly troublesome in dense memory applications. The antiferromagnetic exchange bias layer in the MTJ device ensures that there is a unique and fixed orientation for one of the electrode layer magnetizations at low applied magnetic fields, and thus a unique magnetoresistance response characteristic for the MTJ memory cell at low applied field. For the prior art devices that achieved a step-like magnetoresistance response for low applied fields by using one low coercivity layer and one higher coercivity layer, the response characteristic can be inverted if the cell is momentarily exposed to high magnetic fields, as shown in FIGS. 3A–3B. The MTJ devices according to the present invention with the self-aligned contact holes (FIGS. 4A and 4C) allow for MTJ memory cells to be constructed and wired at the minimum lithographic pitch. Extra lateral tolerances are not required. An additional benefit of the planar top junction electrode and the self-aligned contact hole is that the structure and the fabrication method for it both readily scale to smaller dimensions. This is not the case for MTJ devices that do not have the planarized junction counter electrode and a self-aligned contact because performance limitations will be increasingly severe at smaller dimensions due to misalignments and stray-field affects of the extraneous magnetic poles.

The properties of the free ferromagnetic layer are chosen with regard to optimum writing field and stability of the cell against field excursions. Ni—Fe alloy layers give rise to the smallest switching fields but lower signal. Co—Fe alloys require higher switching fields, but have higher signal and greater stability against field excursions. Co—Fe layers also have greater magnetostriction which may lead to nonuniform properties in the patterned arrays. An optimized free ferromagnetic layer would be comprised of a thin Co—Fe layer at the interface between the free ferromagnetic layer and the insulating tunnel layer, with the bulk of the layer being a low magnetostriction magnetic material, such as Ni—Fe. The properties of the pinned ferromagnetic layer are chosen for greatest stability against field excursions. Ni—Fe alloys display greatest stability using Fe—Mn alloy antiferromagnetic layers because of their higher unidirectional exchange anisotropy as compared with Co—Fe alloy layers. The optimum pinned ferromagnetic layer would be comprised of a zero-magnetostriction Ni—Fe layer with a thin interface layer comprised of a Co—Fe layer for optimum signal, which is obtained with the highest polarization Co—Fe alloy. This is readily determined by examination of the Slater-Pauling curve of magnetic moment versus electrons per atom for Fe—Co—Ni alloys. The Fe—Mn antiferromagnetic layer may be replaced with a Ni—Mn layer or other suitable antiferromagnetic metallic layer which exchange biases the ferromagnetic material in the pinned layer. For example, an electrically conducting antiferromagnetic oxide layer may be used, such as doped NiO or CoO.

Similarly, the stability of the pinned ferromagnetic layer can be increased further by forming it from a sandwich of two magnetic layers, such as Co or Co—Fe alloys, separated by a thin metallic layer, which results in antiferromagnetic coupling of the two magnetic layers. This type of pinned layer is described in IBM's U.S. Pat. 5,465,185. In addition, this type of pinned layer reduces the net magnetic moment of the base electrode, and thus will reduce the magnetostatic coupling of neighboring magnetic elements in the memory array.

MTJ Magnetic Field Sensor

FIGS. 6A–6B illustrate a cross-section and top view, respectively, of an embodiment for an MTJ device structure for use as an external field sensor. The structure is similar to that of FIGS. 4A–4B, except that the top junction electrode stack 70 contains a ferromagnetic layer 72 adjacent to the tunnel barrier layer 20 whose easy axis of magnetization is aligned perpendicular, rather than parallel, to the magnetization of the pinned ferromagnetic layer 18 in the bottom electrode stack 10. The top wiring layer 50 is spaced from the junction by the planarized insulating layer 40. The anisotropy magnitude needs to be appropriately designed for the intended range of fields to be sensed, which may be accomplished as an additive combination of intrinsic anisotropy, strain-induced anisotropy, shape anisotropy, magnetostatic coupling fields, and a compensating field. As described above for the MTJ memory cell, for low applied external fields the magnetization (arrow 19) of the ferromagnetic layer 18 in the bottom electrode 10 is pinned, while the magnetization of the free ferromagnetic layer 72 is free to rotate in the plane of the substrate 9 so as to be either parallel or antiparallel to arrow 73.

Figure 7:
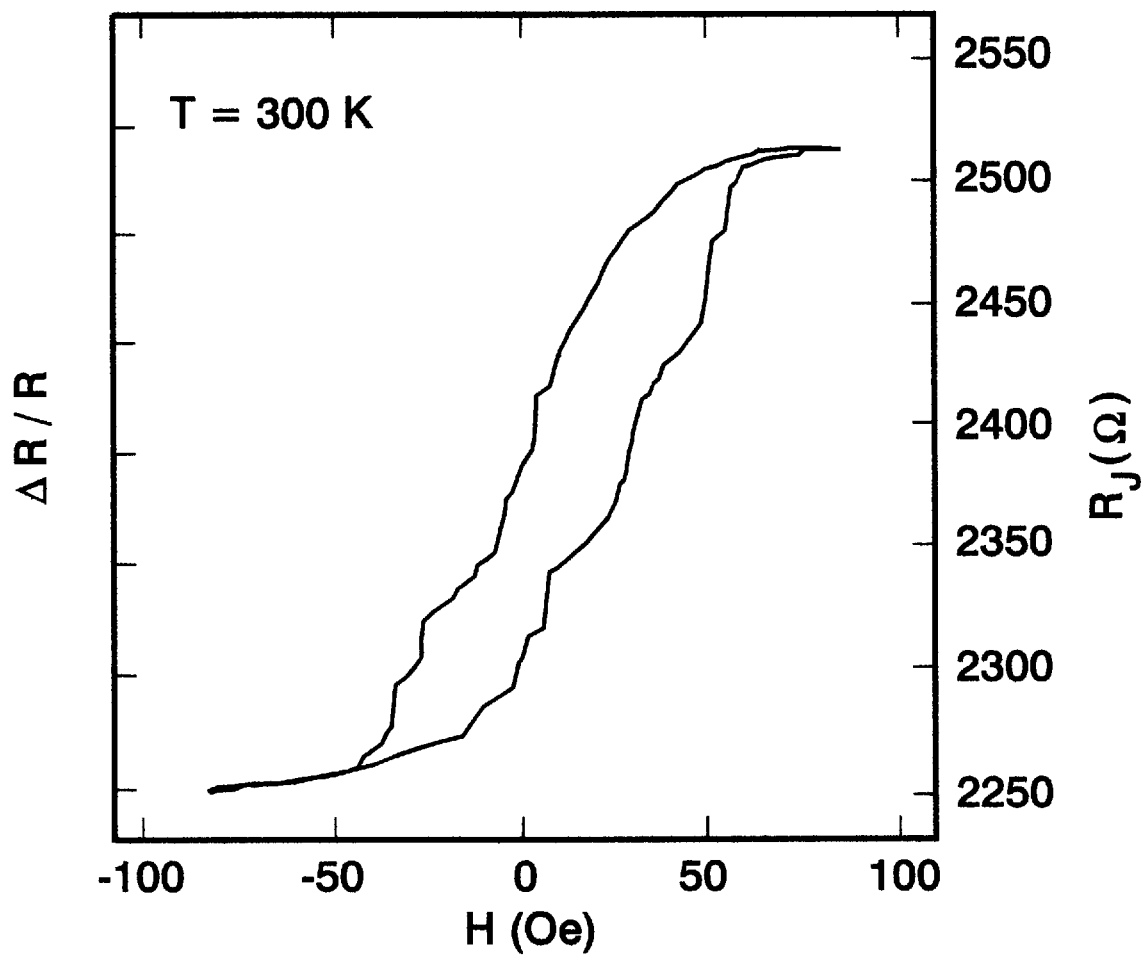
FIG. 7 shows the low-field magnetoresistance response of an MTJ field-sensing device.

MTJ devices for field sensing were fabricated as described above for the memory cell devices, except that the top electrode 70 was given a shape anisotropy to make the easy axis of the free ferromagnetic layer 72 perpendicular to the easy axis of the pinned ferromagnetic layer in the base electrode 10. FIG. 7 shows the low field (+/−60 Oe) magnetoresistance response of an MTJ field-sensing device. The top electrode 70 (FIG. 6B) in this device had a width of 2.5 μm and a length of 12.5 μm in the direction 73 perpendicular to the magnetization direction 19 of the pinned ferromagnetic layer 18 in the base electrode 10 in order to provide the perpendicular shape anisotropy. As the applied field is swept from approximately −10 Oe to 60 Oe along the direction of the base electrode's easy magnetization axis, there is a relatively smooth and monotonic increase of the MTJ resistance from about 2250 Ohms to about 2500 Ohms. As the applied field is swept from approximately 35 Oe to −40 Oe, the resistance changes from 2500 Ohms back to 2250 Ohms. In this MTJ device, the anisotropy of the free ferromagnetic layer 72, which is determined primarily by the shape anisotropy of the 2.5×12.5 μm² pattern of the top electrode 70 to be along direction 73, was perpendicular to the intrinsic anisotropy of the top electrode, which was along the direction 19. Aligning both the intrinsic anisotropy field with that later induced by shape anisotropy to both be along 73 and perpendicular to the easy axis 19 of the pinned ferromagnetic layer 18 in the base electrode 10 could be done to improve the smoothness of the sensor response and to lower the hysteresis of the sensor response. Such an alignment of the top electrode's intrinsic anisotropy can be accomplished by growing the top electrode in an external magnetic field applied in the desired direction 73.

Process for Fabricating the MTJ Devices

Figure 8A:
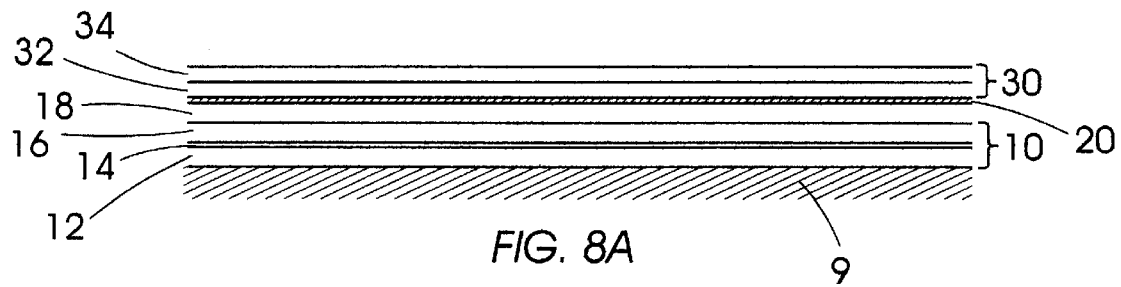
FIGS. 8A–8H show the process steps for fabrication of a planarized MTJ device having a self-aligned contact hole.

The MTJ structures of FIGS. 4C and 6A with the self-aligned, planarized contact layers are preferred for both memory cell and external field-sensing applications, respectively. The preferred process sequence for preparing these devices will be described with reference to the process flow diagram of FIGS. 8A–8H. Initially, all of the layers of the MTJ junction stack are prepared over the entire substrate wafer in a high-vacuum chamber (FIG. 8A). A flat silicon substrate wafer covered with thermal oxide is the preferred substrate 9. Film growths are done by magnetron sputtering with Ar gas with the substrate at ambient temperature. Care must be taken to ensure that the sputter growth produces very smooth films. This can be tested by measuring the giant magnetoresistance effect in test multilayer metallic structures grown under the same growth conditions. An applied magnetic field of magnitude 20–100 Oe, with the field direction in the plane of the substrate, is used to induce magnetic anisotropy into the magnetic layers as they are grown. The initial layer 12 is a good conductor, such as Pt with a thickness of order 20 nm. On top of this is grown a permalloy ($Ni_{81}Fe_{19}$) layer 14 of thickness 4 nm. This layer is a buffer layer and serves to provide a template for proper orientation of the pinning layer, which is next deposited. The pinning layer is a Mn—Fe antiferromagnetic layer 16 of thickness 10 nm deposited from a $Mn_{50}Fe_{50}$ sputtering target. Growth in this manner ensures that the $Mn_{50}Fe_{50}$ layer 16 pins both the underlying 4 nm Ni—Fe layer 14 and the subsequently grown 8 nm Co layer 18. This Pt/Ni—Fe/Mn—Fe/Co stack comprises the base electrode stack 10 of the MTJ device. Next, a thin (1–2 nm thickness) Al layer is deposited on the top layer of the stack 10. This Al layer is subsequently oxidized at an oxygen pressure of 100 mTorr and a power density of 25 W/cm² for 60 to 240 seconds to form an insulating tunnel barrier layer 20 of $Al_2O_3$. The tunnel barrier layer 20 is then covered with an 8 nm $Ni_{81}Fe_{19}$ layer 32 followed by a 20 nm Pt contact layer 34. The layers 32, 34 form the top electrode stack 30. At this point, there is a single MTJ stack that covers the entire substrate wafer (FIG. 8A).

Figure 8B:
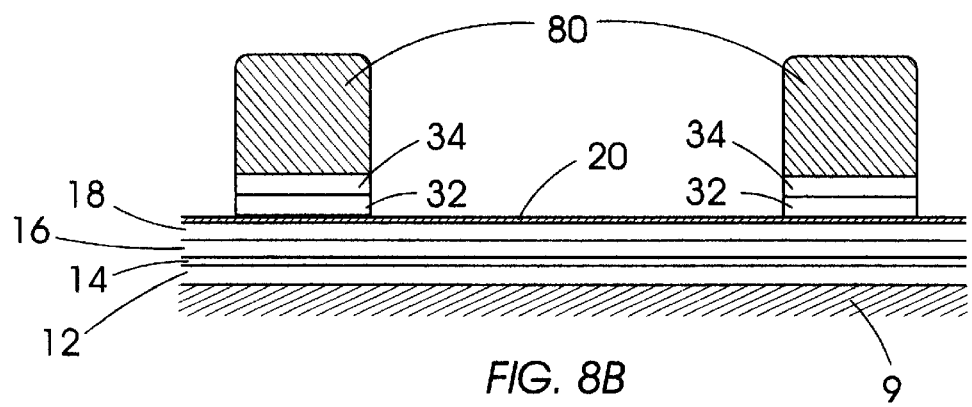
Figure 8C:
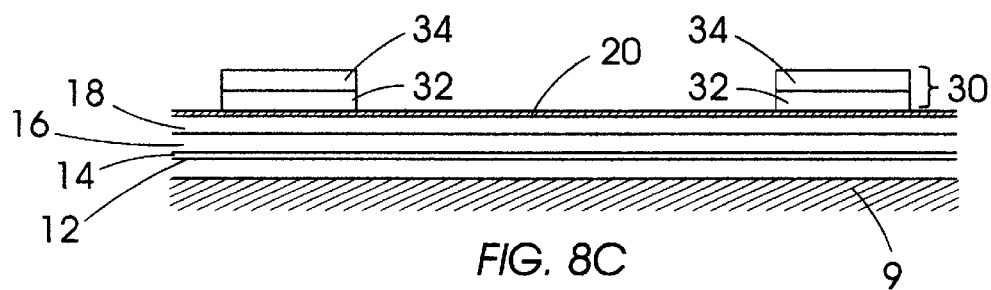
Figure 8D:
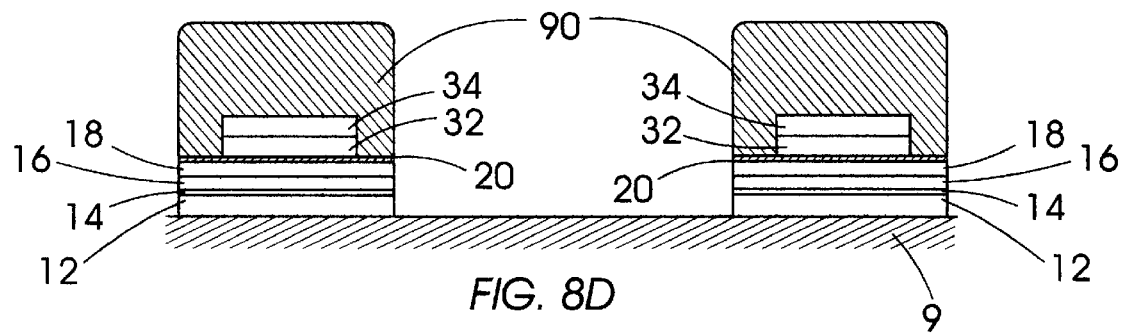
Figure 8E:
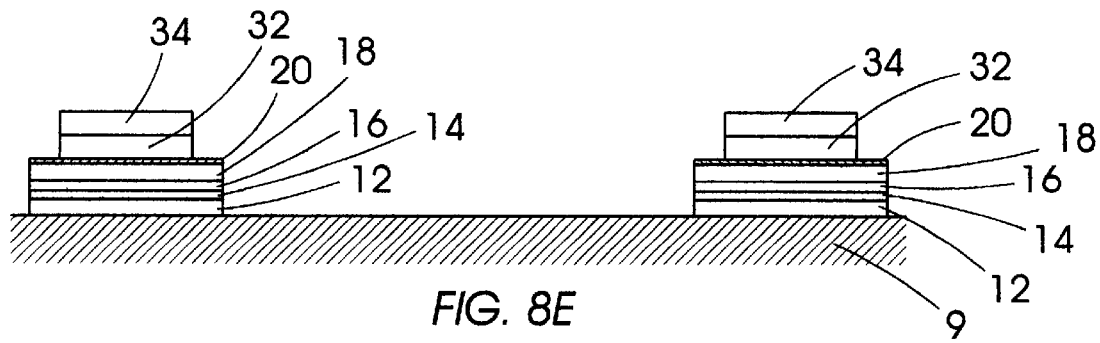
Figure 8F:
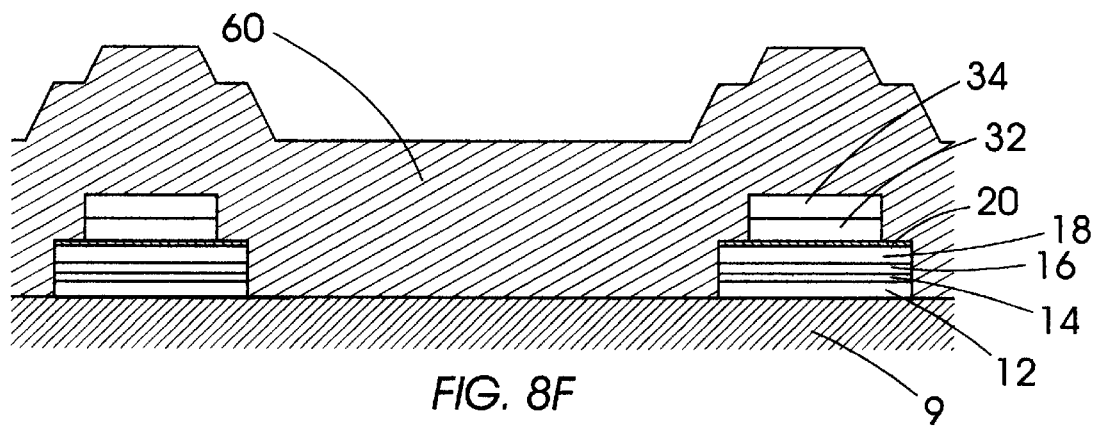
Figure 8G:
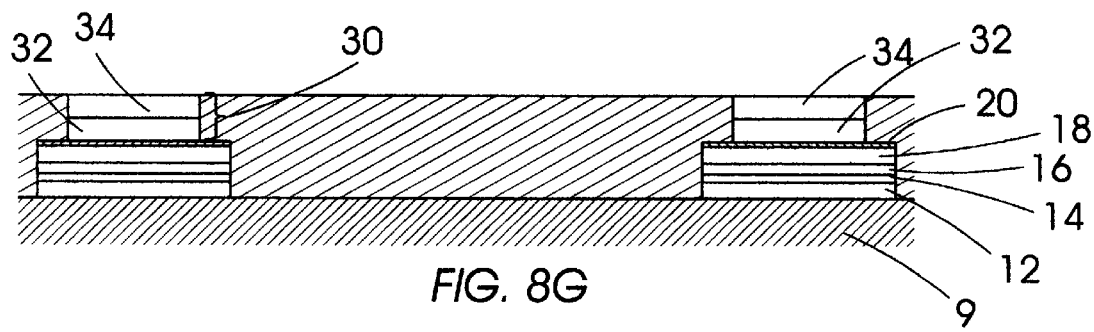
Figure 8H:
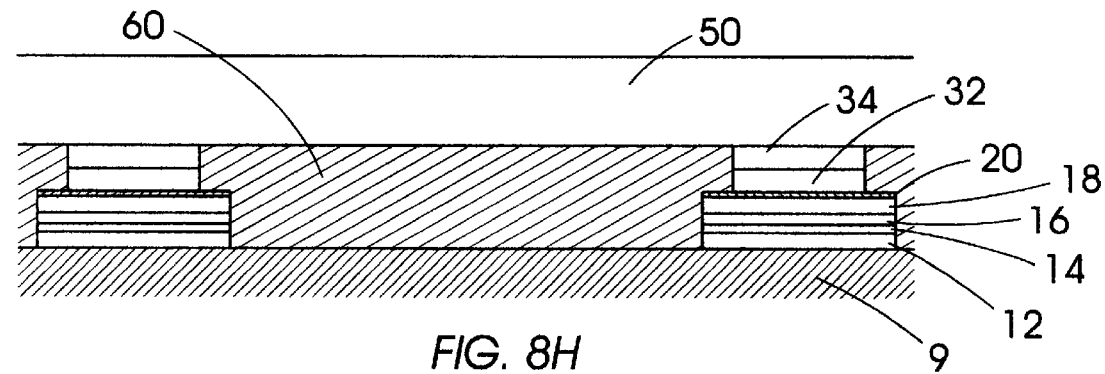

The next sequence of steps is performed to pattern the large junction into many small junctions, and to isolate and to contact these junctions. The pattern is oriented so that the long dimensions of the top and bottom electrode shapes are along the easy axis direction of the magnetic films. A resist stencil 80 in the pattern of the desired top electrode layer is first put on the wafer. For the memory cell application, the shape of the top electrodes may be slightly longer along the easy magnetization access direction so that shape anisotropy adds to the intrinsic top layer anisotropy; for example, a length-to-width ratio of 2 to 1 may be used. The junction stack is then thinned by Ar ion milling down to the $Al_2O_3$ layer in regions not protected by the resist stencil 80. An ion acceleration potential of 400 Volts is suitable, and the milling stop is preferably done by timing based on milling calibration runs, but may be done by detecting the presence of aluminum or oxygen back sputtered from the stack. The etching must be completely through the top electrode stack 30, and preferably should stop somewhere inside the tunnel barrier layer 20. FIG. 8B shows the structure cross-section after the milling step is completed, but before the resist stencil 80 is stripped. FIG. 8C shows the structure cross-section after the resist stencil 80 has been stripped. A second resist pattern 90 is then put on the wafer to allow for Ar ion milling removal of selected regions of tunnel barrier 20 and base electrode stack 10, which are not protected by the resist. Timed ion milling may again be used for this processing step. FIG. 8D shows the structure cross-section with the resist pattern on after the base electrode milling has been completed. Fig. 8E shows the structure after the resist stencil 80 has been stripped. Next, a conformal insulating layer 60, preferably sputtered $SiO_2$, is then put over the entire patterned junction structure as shown in FIG. 8F. The thickness of this layer should be about 150 to 200 nm. Care should be taken during the milling and deposition steps not to raise the junction temperature above about 150° C. Next, contact holes are opened up to the top junction electrode layer 30. This is preferably done by chemical-mechanical polishing of the sputtered $SiO_2$ layer 60, stopping when the junction counter electrodes are exposed, with the stop time determined by calibration runs. The resulting structure after the polishing step is completed is shown in FIG. 8G. The top wiring layer 50, for example, Pt of thickness 100 to 300 nm, is then sputtered on top of this structure to make contacts to the junction top electrodes and provide a wiring layer. A thin 1 nm layer of Ti is preferably used prior to the Pt deposition to promote better adhesion. A resist pattern is formed on this layer, and the Pt etched or milled away to leave the desired top electrode wiring pattern. FIG. 8H shows a cross-section of the structure after the Pt layer 50 has been applied. In this structure, the top layer is used for wiring along the direction of the cross-section so the patterning of the top layer, which would be in a direction out of the paper, is not evident. Al, W, or Cu are alternative wiring layers that may be substituted for the Pt layer.

The above sequence of fabrication steps is most suitable for fabrication of the memory cell device. For fabricating the MTJ devices for sensing external magnetic fields, the only changes are a 90° rotation of the direction of intrinsic and shape anisotropies for the top junction electrode layer during layer growth. It is preferred that the top junction electrode layer of $Ni_{81}Fe_{19}$ be grown in an external magnetic field that is rotated 90° in the plane of the substrate from the field orientation used for the base electrode ferromagnetic layers.

This is accomplished by either rotating the substrate wafers in the growth chamber by 90° after the base electrode stack is grown, or by rotating the direction of the applied magnetic field used during growth. For the external field sensor MTJ device, any shape anisotropy used to enhance the anisotropy of the top electrode layer should be along the easy axis direction for the top electrode, and thus perpendicular to that of the base electrode.

The Al layer 20 thickness and oxidation time has to be fine-tuned according to the junction size used and the desired application. For the memory cell application, it is desirable that the cell resistance be relatively high, at least greater than 1000 Ohms. For high speed in the external field-sensing application, it is desirable that the MTJ resistance be of the order of 50–100 Ohms.

For both the memory and sensing applications, it is desirable to use the highest polarization layers adjacent to the tunnel barrier layer 20 that give coercive fields in the desired range. The use of very thin interfacial layers of high polarization material, such as Co, Fe—Co, or Ni—Mn—Sb, may be used immediately adjacent to tunnel barrier 20 to further enhance the device magnetoresistance, while not appreciably altering the coercive fields of ferromagnetic layers 18 and 32.

In the MTJ devices of the present invention, magnetoresistance responses of up to 18% have been achieved in MTJ devices of sizes down to a few microns in dimension. Also, magnetoresistance responses as large as 25% have been achieved for more optimized MTJ layers using larger test structures patterned by simpler means.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:

a planar pinned ferromagnetic layer having first and second generally parallel surfaces, the pinned layer comprising a sandwich of two antiferromagnetically coupled ferromagnetic layers separated by a metallic layer;

an antiferromagnetic layer formed on and in contact with the first surface of the pinned ferromagnetic layer for pinning the magnetization of the pinned ferromagnetic layer in a preferred direction and substantially preventing its rotation in the presence of an applied magnetic field;

an insulating tunnel barrier layer located on and in contact with the second surface of the pinned ferromagnetic layer;

a planar free ferromagnetic layer located on and in contact with the insulating tunnel barrier layer, the free ferromagnetic layer having a magnetization free to rotate in the presence of an applied magnetic field;

wherein the pinned and free ferromagnetic layers are in separate spaced-apart planes without overlap of the insulating tunnel barrier layer; and a substrate, the pinned ferromagnetic layer, the antiferromagnetic layer, the tunnel barrier layer and the free ferromagnetic layer being formed on the substrate, whereby tunneling current passes through the tunnel barrier layer in a direction generally perpendicular to the planar pinned and free ferromagnetic layers when the planar pinned and free ferromagnetic layers are connected to electrical circuitry.

2. The magnetic tunnel junction device according to claim 1 wherein the magnetization directions of the pinned and free ferromagnetic layers are substantially parallel or anti-parallel to one another in the absence of an applied magnetic field.

3. The magnetic tunnel junction device according to claim 1 wherein the free ferromagnetic layer's magnetization direction is substantially perpendicular to the pinned ferromagnetic layer's magnetization direction in the absence of an applied magnetic field.

4. The magnetic tunnel junction device according to claim 1 wherein the lateral perimeters of the pinned and free ferromagnetic layers are generally rectangularly shaped, and wherein the magnetization directions of the pinned and free ferromagnetic layers are aligned generally along the lengths of the rectangles.

5. The magnetic tunnel junction device according to claim 1 further comprising a nonmagnetic conductor layer electrically connected to the free ferromagnetic layer and an insulator layer surrounding the lateral perimeter of the free ferromagnetic layer and supporting the insulator layer on a plane substantially parallel to the first and second surfaces of the free ferromagnetic layer.

* * * * *